United States Patent [19]

Sako et al.

[11] Patent Number: 5,206,646

[45] Date of Patent: Apr. 27, 1993

[54] DIGITAL MODULATING METHOD

[75] Inventors: Yoichiro Sako, Chiba; Tamotsu Yamagami, Kanagawa, both of Japan

[73] Assignee: Sony Corporation, Tokyo, Japan

[21] Appl. No.: 603,932

[22] Filed: Oct. 26, 1990

[30] Foreign Application Priority Data

Oct. 31, 1989 [JP] Japan ................................ 1-284401
Oct. 31, 1989 [JP] Japan ................................ 1-284402

[51] Int. Cl.$^5$ ............................................. H03M 7/20
[52] U.S. Cl. ..................................... 341/95; 341/102
[58] Field of Search ................. 341/95, 73, 58, 68, 341/102; 360/40, 41

[56] References Cited

U.S. PATENT DOCUMENTS

| 3,689,899 | 9/1972 | Franaszek . | |
|---|---|---|---|
| 4,323,931 | 4/1982 | Jacoby | 360/40 |
| 4,358,852 | 11/1982 | Ichikawa et al. | 360/40 X |
| 4,456,905 | 6/1984 | Odaka | 360/40 X |
| 4,496,934 | 1/1985 | Furukawa | 360/40 X |
| 4,598,326 | 7/1986 | Leiner | 341/95 X |
| 4,728,929 | 3/1988 | Tanaka | 341/95 X |

FOREIGN PATENT DOCUMENTS 0074656 3/1983 European Pat. Off. .
2486740 1/1981 France .

OTHER PUBLICATIONS

Radio and Electronic Engineer, vol. 53, No. 2, Feb. 1983, "Optimization of Low-Frequency Properties of 8 to 14 Modulation", K. Immink.
Journal of the Audio Engineering Society, vol. 31, No. 4, Apr. 1983, "Channel Codings for Digital Audio Recordings", Toshi T. Doi.
ICASSP 81 Proceedings, "IEEE International Conference on Acoustics, Speech and Signal Processing", Mar. 30, 1981, vol. 1, K. Immink.
IBM Technical Disclosure Bulletin, vol. 24, No. 6, Nov. 1981, "DC Limited Recording Code and Implementation", J. A. Rooney.
IEEE Spectrum, vol. 23, No. 4, "The Compact Disk ROM: How It Works".
Philips Technical Review, vol. 40, No. 6 (1982), "Compact Disc: System Aspects and Modulation", P. P. Chen.
Frequencz, vol. 40, No. 7, Jul. 1986, "Optimization of the Receiving-Filtering of Magneto-Optical Recorded EFM-Coded Digital Signals".

Primary Examiner—Sharon D. Logan
Attorney, Agent, or Firm—Lewis H. Eslinger; Jay H. Maioli

[57] ABSTRACT

This invention relates to a digital modulating method used for recording a PCM audio signal, computer data, and etc. on a recording medium such as an optical disc. The digital modulating method is constructed so that the minimum length between transition could be the maximum in encoding M bits into N bits (M<N), and can generate clock pulses with a simple circuit arrangement by satisfying the relationship N=αM, where α is an integer equal to or larger than 2.

Further, by converting a predetermined unit of input data into a first code signal according to substantially the same conversion rule and selectively adding coupling bits of different bit number to each junction between a first code signal and an adjacent code signal, the digital modulating method is adaptable for various transmission systems with a simple arrangement.

12 Claims, 18 Drawing Sheets

Fig. 2A

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 c15 c16 |
| 0  | 0 0 0 0 0 0 0 0 | 0 1 0 0 1 0 0 0 1 0 0 0 0 0 0 0 |
| 1  | 0 0 0 0 0 0 0 1 | 1 0 0 0 0 1 0 0 0 0 0 0 0 0 0 0 |
| 2  | 0 0 0 0 0 0 1 0 | 1 0 0 1 0 0 0 0 1 0 0 0 0 0 0 0 |
| 3  | 0 0 0 0 0 0 1 1 | 1 0 0 0 1 0 0 1 0 0 0 0 0 0 0 0 |
| 4  | 0 0 0 0 0 1 0 0 | 0 1 0 0 0 1 0 0 0 0 0 0 0 0 0 0 |
| 5  | 0 0 0 0 0 1 0 1 | 0 0 0 0 0 1 0 0 1 0 0 0 0 0 0 0 |
| 6  | 0 0 0 0 0 1 1 0 | 0 0 0 1 0 0 0 1 0 0 0 0 0 0 0 0 |
| 7  | 0 0 0 0 0 1 1 1 | 0 0 1 0 0 1 0 0 0 0 0 0 0 0 0 0 |
| 8  | 0 0 0 0 1 0 0 0 | 0 1 0 0 1 0 0 1 0 0 0 0 0 0 0 0 |
| 9  | 0 0 0 0 1 0 0 1 | 1 0 0 0 0 0 1 0 0 0 0 0 0 0 0 0 |
| 10 | 0 0 0 0 1 0 1 0 | 1 0 0 1 0 0 1 0 0 0 0 0 0 0 0 0 |
| 11 | 0 0 0 0 1 0 1 1 | 1 0 0 0 1 0 0 1 0 0 0 0 0 0 0 0 |
| 12 | 0 0 0 0 1 1 0 0 | 0 1 0 0 0 0 1 0 0 0 0 0 0 0 0 0 |
| 13 | 0 0 0 0 1 1 0 1 | 0 0 0 0 0 0 1 0 0 0 0 0 0 0 0 0 |
| 14 | 0 0 0 0 1 1 1 0 | 0 0 0 1 0 0 0 1 0 0 0 0 0 0 0 0 |
| 15 | 0 0 0 0 1 1 1 1 | 0 0 1 0 0 0 1 0 0 0 0 0 0 0 0 0 |
| 16 | 0 0 0 1 0 0 0 0 | 1 0 0 0 0 0 0 1 0 0 0 0 0 0 0 0 |
| 17 | 0 0 0 1 0 0 0 1 | 1 0 0 0 0 0 1 0 0 0 0 0 0 0 0 0 |
| 18 | 0 0 0 1 0 0 1 0 | 1 0 0 1 0 0 1 0 0 0 0 0 0 0 0 0 |
| 19 | 0 0 0 1 0 0 1 1 | 0 0 1 0 0 0 0 1 0 0 0 0 0 0 0 0 |
| 20 | 0 0 0 1 0 1 0 0 | 0 1 0 0 0 1 0 0 0 0 0 0 0 0 0 0 |
| 21 | 0 0 0 1 0 1 0 1 | 0 0 0 0 0 1 0 0 0 0 0 0 0 0 0 0 |
| 22 | 0 0 0 1 0 1 1 0 | 0 0 0 1 0 1 0 0 0 0 0 0 0 0 0 0 |
| 23 | 0 0 0 1 0 1 1 1 | 0 0 1 0 0 1 0 0 0 0 0 0 0 0 0 0 |
| 24 | 0 0 0 1 1 0 0 0 | 0 1 0 0 1 0 0 0 1 0 0 0 0 0 0 0 |
| 25 | 0 0 0 1 1 0 0 1 | 1 0 0 0 0 0 0 0 1 0 0 0 0 0 0 0 |
| 26 | 0 0 0 1 1 0 1 0 | 1 0 0 1 0 0 0 0 1 0 0 0 0 0 0 0 |
| 27 | 0 0 0 1 1 0 1 1 | 1 0 0 0 1 0 0 0 1 0 0 0 0 0 0 0 |
| 28 | 0 0 0 1 1 1 0 0 | 0 1 0 0 0 0 0 0 1 0 0 0 0 0 0 0 |
| 29 | 0 0 0 1 1 1 0 1 | 0 0 0 0 1 0 0 0 1 0 0 0 0 0 0 0 |
| 30 | 0 0 0 1 1 1 1 0 | 0 0 0 1 0 0 0 0 1 0 0 0 0 0 0 0 |
| 31 | 0 0 0 1 1 1 1 1 | 0 0 1 0 0 0 0 0 1 0 0 0 0 0 0 0 |

Fig. 2B

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 c15 c16 |
| 32 | 0 0 1 0 0 0 0 0 | 0 0 0 0 0 0 0 0 1 0 0 0 0 0 0 0 |
| 33 | 0 0 1 0 0 0 0 1 | 1 0 0 0 0 1 0 0 0 0 1 0 0 0 0 0 |
| 34 | 0 0 1 0 0 0 1 0 | 0 0 0 0 1 0 0 0 1 0 0 0 0 0 0 0 |
| 35 | 0 0 1 0 0 0 1 1 | 0 0 1 0 0 1 0 0 1 0 0 0 0 0 0 0 |
| 36 | 0 0 1 0 0 1 0 0 | 0 1 0 0 0 1 0 0 0 0 1 0 0 0 0 0 |
| 37 | 0 0 1 0 0 1 0 1 | 0 0 0 0 0 1 0 0 0 0 1 0 0 0 0 0 |
| 38 | 0 0 1 0 0 1 1 0 | 0 1 0 0 0 0 0 1 0 0 0 0 0 0 0 0 |
| 39 | 0 0 1 0 0 1 1 1 | 0 0 1 0 0 1 0 0 0 1 0 0 0 0 0 0 |
| 40 | 0 0 1 0 1 0 0 0 | 0 1 0 0 1 0 0 1 0 0 1 0 0 0 0 0 |
| 41 | 0 0 1 0 1 0 0 1 | 1 0 0 0 0 0 0 1 0 0 1 0 0 0 0 0 |
| 42 | 0 0 1 0 1 0 1 0 | 1 0 0 1 0 0 1 0 0 1 0 0 0 0 0 0 |
| 43 | 0 0 1 0 1 0 1 1 | 1 0 0 0 1 0 0 1 0 0 1 0 0 0 0 0 |
| 44 | 0 0 1 0 1 1 0 0 | 0 1 0 0 0 0 1 0 0 1 0 0 0 0 0 0 |
| 45 | 0 0 1 0 1 1 0 1 | 0 0 0 0 0 0 1 0 0 1 0 0 0 0 0 0 |
| 46 | 0 0 1 0 1 1 1 0 | 0 0 0 1 0 0 1 0 0 1 0 0 0 0 0 0 |
| 47 | 0 0 1 0 1 1 1 1 | 0 0 1 0 0 0 1 0 0 1 0 0 0 0 0 0 |
| 48 | 0 0 1 1 0 0 0 0 | 0 0 0 0 1 0 0 0 0 0 0 0 0 0 0 0 |
| 49 | 0 0 1 1 0 0 0 1 | 1 0 0 0 0 0 1 0 0 1 0 0 0 0 0 0 |
| 50 | 0 0 1 1 0 0 1 0 | 1 0 0 1 0 0 1 0 0 1 0 0 0 0 0 0 |
| 51 | 0 0 1 1 0 0 1 1 | 1 0 0 0 0 1 0 0 0 1 0 0 0 0 0 0 |
| 52 | 0 0 1 1 0 1 0 0 | 0 1 0 0 0 1 0 0 0 1 0 0 0 0 0 0 |
| 53 | 0 0 1 1 0 1 0 1 | 0 0 0 0 0 1 0 0 0 1 0 0 0 0 0 0 |
| 54 | 0 0 1 1 0 1 1 0 | 0 0 0 1 0 1 0 0 0 1 0 0 0 0 0 0 |
| 55 | 0 0 1 1 0 1 1 1 | 0 0 1 0 0 1 0 0 0 1 0 0 0 0 0 0 |
| 56 | 0 0 1 1 1 0 0 0 | 0 1 0 0 1 0 0 0 0 1 0 0 0 0 0 0 |
| 57 | 0 0 1 1 1 0 0 1 | 1 0 0 0 0 0 0 0 0 1 0 0 0 0 0 0 |
| 58 | 0 0 1 1 1 0 1 0 | 1 0 0 1 0 0 0 0 0 1 0 0 0 0 0 0 |
| 59 | 0 0 1 1 1 0 1 1 | 1 0 0 0 1 0 0 0 0 1 0 0 0 0 0 0 |
| 60 | 0 0 1 1 1 1 0 0 | 0 1 0 0 0 0 0 0 0 1 0 0 0 0 0 0 |
| 61 | 0 0 1 1 1 1 0 1 | 0 0 0 0 1 0 0 0 0 1 0 0 0 0 0 0 |
| 62 | 0 0 1 1 1 1 1 0 | 0 0 0 0 1 0 0 0 0 1 0 0 0 0 0 0 |
| 63 | 0 0 1 1 1 1 1 1 | 0 0 1 0 0 0 0 0 0 1 0 0 0 0 0 0 |

Fig. 2C

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 c15 c16 |
| 64 | 0 1 0 0 0 0 0 0 | 0 1 0 0 1 0 0 0 1 0 0 1 0 0 0 0 |
| 65 | 0 1 0 0 0 0 0 1 | 1 0 0 0 0 1 0 0 1 0 0 1 0 0 0 0 |
| 66 | 0 1 0 0 0 0 1 0 | 1 0 0 1 0 0 0 1 0 0 1 0 0 0 0 0 |
| 67 | 0 1 0 0 0 0 1 1 | 1 0 0 0 1 0 0 0 1 0 0 1 0 0 0 0 |
| 68 | 0 1 0 0 0 1 0 0 | 0 1 0 0 0 1 0 0 1 0 0 1 0 0 0 0 |
| 69 | 0 1 0 0 0 1 0 1 | 0 0 0 0 0 0 0 1 0 0 1 0 0 0 0 0 |
| 70 | 0 1 0 0 0 1 1 0 | 0 0 0 1 0 0 0 1 0 0 1 0 0 0 0 0 |
| 71 | 0 1 0 0 0 1 1 1 | 0 0 1 0 0 1 0 0 1 0 0 1 0 0 0 0 |
| 72 | 0 1 0 0 1 0 0 0 | 0 1 0 0 1 0 0 1 0 0 0 1 0 0 0 0 |
| 73 | 0 1 0 0 1 0 0 1 | 1 0 0 0 0 0 0 1 0 0 0 1 0 0 0 0 |
| 74 | 0 1 0 0 1 0 1 0 | 1 0 0 1 0 0 0 1 0 0 0 1 0 0 0 0 |
| 75 | 0 1 0 0 1 0 1 1 | 1 0 0 0 1 0 0 1 0 0 0 1 0 0 0 0 |
| 76 | 0 1 0 0 1 1 0 0 | 0 1 0 0 0 0 0 1 0 0 0 1 0 0 0 0 |
| 77 | 0 1 0 0 1 1 0 1 | 0 0 0 0 0 0 1 0 0 0 1 0 0 0 0 0 |
| 78 | 0 1 0 0 1 1 1 0 | 0 0 0 1 0 0 0 1 0 0 0 1 0 0 0 0 |
| 79 | 0 1 0 0 1 1 1 1 | 0 0 1 0 0 0 0 0 0 0 1 0 0 0 0 0 |
| 80 | 0 1 0 1 0 0 0 0 | 1 0 0 0 0 0 0 1 0 0 1 0 0 0 0 0 |
| 81 | 0 1 0 1 0 0 0 1 | 1 0 0 0 0 0 1 0 0 0 1 0 0 0 0 0 |
| 82 | 0 1 0 1 0 0 1 0 | 1 0 0 1 0 0 1 0 0 0 0 1 0 0 0 0 |
| 83 | 0 1 0 1 0 0 1 1 | 0 0 1 0 0 0 0 1 0 0 1 0 0 0 0 0 |
| 84 | 0 1 0 1 0 1 0 0 | 0 1 0 0 0 0 1 0 0 0 0 1 0 0 0 0 |
| 85 | 0 1 0 1 0 1 0 1 | 0 0 0 0 0 0 1 0 0 0 0 1 0 0 0 0 |
| 86 | 0 1 0 1 0 1 1 0 | 0 0 0 1 0 0 1 0 0 0 0 1 0 0 0 0 |
| 87 | 0 1 0 1 0 1 1 1 | 0 0 1 0 0 0 1 0 0 0 0 1 0 0 0 0 |
| 88 | 0 1 0 1 1 0 0 0 | 0 1 0 0 1 0 0 0 0 0 0 1 0 0 0 0 |
| 89 | 0 1 0 1 1 0 0 1 | 1 0 0 0 0 0 0 0 0 0 0 1 0 0 0 0 |
| 90 | 0 1 0 1 1 0 1 0 | 1 0 0 1 0 0 0 0 0 0 0 1 0 0 0 0 |
| 91 | 0 1 0 1 1 0 1 1 | 1 0 0 0 1 0 0 0 0 0 0 1 0 0 0 0 |
| 92 | 0 1 0 1 1 1 0 0 | 0 1 0 0 0 0 0 0 0 0 0 1 0 0 0 0 |
| 93 | 0 1 0 1 1 1 0 1 | 0 0 0 0 1 0 0 0 0 0 0 1 0 0 0 0 |
| 94 | 0 1 0 1 1 1 1 0 | 0 0 0 1 0 0 0 0 0 0 0 1 0 0 0 0 |
| 95 | 0 1 0 1 1 1 1 1 | 0 0 1 0 0 0 0 0 0 0 0 1 0 0 0 0 |

Fig. 2D

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 c15 c16 |
| 96  | 0 1 1 0 0 0 0 0 | 0 1 0 0 1 0 0 0 1 0 0 0 1 0 0 0 |
| 97  | 0 1 1 0 0 0 0 1 | 1 0 0 0 0 1 0 0 1 0 0 0 1 0 0 0 |
| 98  | 0 1 1 0 0 0 1 0 | 1 0 0 1 0 0 0 1 0 0 0 1 0 0 0 |
| 99  | 0 1 1 0 0 0 1 1 | 1 0 0 0 1 0 0 0 1 0 0 0 1 0 0 0 |
| 100 | 0 1 1 0 0 1 0 0 | 0 1 0 0 0 1 0 0 1 0 0 0 1 0 0 0 |
| 101 | 0 1 1 0 0 1 0 1 | 0 0 0 0 0 0 0 1 0 0 0 1 0 0 0 |
| 102 | 0 1 1 0 0 1 1 0 | 0 1 0 0 0 0 0 1 0 0 1 0 0 0 0 |
| 103 | 0 1 1 0 0 1 1 1 | 0 0 1 0 0 1 0 0 1 0 0 0 1 0 0 0 |
| 104 | 0 1 1 0 1 0 0 0 | 0 1 0 0 1 0 0 1 0 0 0 1 0 0 0 |
| 105 | 0 1 1 0 1 0 0 1 | 1 0 0 0 0 0 1 0 0 0 0 1 0 0 0 |
| 106 | 0 1 1 0 1 0 1 0 | 1 0 0 1 0 0 0 1 0 0 0 1 0 0 0 |
| 107 | 0 1 1 0 1 0 1 1 | 1 0 0 0 1 0 0 1 0 0 0 1 0 0 0 |
| 108 | 0 1 1 0 1 1 0 0 | 0 1 0 0 0 0 0 1 0 0 0 1 0 0 0 |
| 109 | 0 1 1 0 1 1 0 1 | 0 0 0 0 0 0 1 0 0 0 0 1 0 0 0 |
| 110 | 0 1 1 0 1 1 1 0 | 0 0 0 1 0 0 0 1 0 0 0 1 0 0 0 |
| 111 | 0 1 1 0 1 1 1 1 | 0 0 1 0 0 0 0 1 0 0 0 1 0 0 0 |
| 112 | 0 1 1 1 0 0 0 0 | 1 0 0 0 0 0 0 1 0 0 0 1 0 0 0 |
| 113 | 0 1 1 1 0 0 0 1 | 1 0 0 0 0 0 1 0 0 0 0 1 0 0 0 |
| 114 | 0 1 1 1 0 0 1 0 | 1 0 0 1 0 0 1 0 0 0 0 1 0 0 0 |
| 115 | 0 1 1 1 0 0 1 1 | 0 0 1 0 0 0 0 1 0 0 0 1 0 0 0 |
| 116 | 0 1 1 1 0 1 0 0 | 0 1 0 0 0 1 0 0 0 0 0 1 0 0 0 |
| 117 | 0 1 1 1 0 1 0 1 | 0 0 0 0 0 1 0 0 0 0 0 1 0 0 0 |
| 118 | 0 1 1 1 0 1 1 0 | 0 0 0 1 0 1 0 0 0 0 0 1 0 0 0 |
| 119 | 0 1 1 1 0 1 1 1 | 0 0 1 0 0 1 0 0 0 0 0 1 0 0 0 |
| 120 | 0 1 1 1 1 0 0 0 | 0 1 0 0 1 0 0 0 0 0 0 1 0 0 0 |
| 121 | 0 1 1 1 1 0 0 1 | 0 0 0 0 1 0 0 1 0 0 1 0 0 0 0 0 |
| 122 | 0 1 1 1 1 0 1 0 | 1 0 0 1 0 0 0 0 0 0 0 1 0 0 0 |
| 123 | 0 1 1 1 1 0 1 1 | 1 0 0 0 1 0 0 0 0 0 0 1 0 0 0 |
| 124 | 0 1 1 1 1 1 0 0 | 0 1 0 0 0 0 0 0 0 0 0 1 0 0 0 |
| 125 | 0 1 1 1 1 1 0 1 | 0 0 0 0 1 0 0 0 0 0 0 1 0 0 0 |
| 126 | 0 1 1 1 1 1 1 0 | 0 0 0 1 0 0 0 0 0 0 0 1 0 0 0 |
| 127 | 0 1 1 1 1 1 1 1 | 0 0 1 0 0 0 0 0 0 0 0 1 0 0 0 |

Fig. 2E

|     | DATA BITS | CHANNEL BITS |
|-----|-----------|--------------|
|     | d1 d2 d3 d4 d5 d6 d7 d8 | c1 c2 c3 c4 c5 c6 c7 c8 c9 c10 c11 c12 c13 c14 c15 c16 |
| 128 | 1 0 0 0 0 0 0 0 | 0 1 0 0 1 0 0 0 1 0 0 0 0 1 0 0 |
| 129 | 1 0 0 0 0 0 0 1 | 1 0 0 0 0 1 0 0 1 0 0 0 0 1 0 0 |
| 130 | 1 0 0 0 0 0 1 0 | 1 0 0 1 0 0 0 1 0 0 0 0 1 0 0 |
| 131 | 1 0 0 0 0 0 1 1 | 1 0 0 0 1 0 0 0 1 0 0 0 0 1 0 0 |
| 132 | 1 0 0 0 0 1 0 0 | 0 1 0 0 0 1 0 0 1 0 0 0 0 1 0 0 |
| 133 | 1 0 0 0 0 1 0 1 | 0 0 0 0 0 0 0 1 0 0 0 0 1 0 0 |
| 134 | 1 0 0 0 0 1 1 0 | 0 0 0 1 0 0 0 1 0 0 0 0 1 0 0 |
| 135 | 1 0 0 0 0 1 1 1 | 0 0 1 0 0 1 0 0 1 0 0 0 0 1 0 0 |
| 136 | 1 0 0 0 1 0 0 0 | 0 1 0 0 1 0 0 1 0 0 0 0 1 0 0 |
| 137 | 1 0 0 0 1 0 0 1 | 1 0 0 0 0 0 1 0 0 0 0 0 1 0 0 |
| 138 | 1 0 0 0 1 0 1 0 | 1 0 0 1 0 0 0 1 0 0 0 0 1 0 0 |
| 139 | 1 0 0 0 1 0 1 1 | 1 0 0 0 1 0 1 0 0 0 0 0 1 0 0 |
| 140 | 1 0 0 0 1 1 0 0 | 0 1 0 0 0 0 1 0 0 0 0 0 1 0 0 |
| 141 | 1 0 0 0 1 1 0 1 | 0 0 0 0 0 0 1 0 0 0 0 0 1 0 0 |
| 142 | 1 0 0 0 1 1 1 0 | 0 0 0 1 0 0 1 0 0 0 0 0 1 0 0 |
| 143 | 1 0 0 0 1 1 1 1 | 0 0 1 0 0 0 1 0 0 0 0 0 1 0 0 |
| 144 | 1 0 0 1 0 0 0 0 | 1 0 0 0 0 0 0 1 0 0 0 0 1 0 0 |
| 145 | 1 0 0 1 0 0 0 1 | 1 0 0 0 0 1 0 0 0 0 0 0 1 0 0 |
| 146 | 1 0 0 1 0 0 1 0 | 1 0 0 1 0 1 0 0 0 0 0 0 1 0 0 |
| 147 | 1 0 0 1 0 0 1 1 | 0 0 1 0 0 0 0 1 0 0 0 0 1 0 0 |
| 148 | 1 0 0 1 0 1 0 0 | 0 1 0 0 0 0 1 0 0 0 0 0 1 0 0 |
| 149 | 1 0 0 1 0 1 0 1 | 0 0 0 0 0 1 0 0 0 0 0 0 1 0 0 |
| 150 | 1 0 0 1 0 1 1 0 | 0 0 0 1 0 0 1 0 0 0 0 0 1 0 0 |
| 151 | 1 0 0 1 0 1 1 1 | 0 0 1 0 0 1 0 0 0 0 0 0 1 0 0 |
| 152 | 1 0 0 1 1 0 0 0 | 0 1 0 0 1 0 0 0 0 0 0 0 1 0 0 |
| 153 | 1 0 0 1 1 0 0 1 | 1 0 0 0 0 1 0 0 1 0 0 0 0 0 0 |
| 154 | 1 0 0 1 1 0 1 0 | 1 0 0 1 0 0 0 0 0 0 0 0 1 0 0 |
| 155 | 1 0 0 1 1 0 1 1 | 1 0 0 0 1 0 0 0 0 0 0 0 1 0 0 |
| 156 | 1 0 0 1 1 1 0 0 | 0 1 0 0 0 0 1 0 0 1 0 0 0 0 0 0 |
| 157 | 1 0 0 1 1 1 0 1 | 0 0 0 0 1 0 0 0 0 0 0 0 1 0 0 |
| 158 | 1 0 0 1 1 1 1 0 | 0 0 0 1 0 0 0 0 0 0 0 0 1 0 0 |
| 159 | 1 0 0 1 1 1 1 1 | 0 0 1 0 0 0 1 0 0 1 0 0 0 0 0 0 |

Fig. 2F

| | DATA BITS | CHANNEL BITS | | | | | | | | | | | | | | | |
|---|---|---|---|---|---|---|---|---|---|---|---|---|---|---|---|---|---|
| | d1 d2 d3 d4 d5 d6 d7 d8 | c1 | c2 | c3 | c4 | c5 | c6 | c7 | c8 | c9 | c10 | c11 | c12 | c13 | c14 | c15 | c16 |
| 160 | 1 0 1 0 0 0 0 0 | 0 | 0 | 0 | 0 | 1 | 0 | 0 | 0 | 1 | 0 | 0 | 0 | 1 | 0 | 0 | 0 |
| 161 | 1 0 1 0 0 0 0 1 | 1 | 0 | 0 | 0 | 0 | 1 | 0 | 0 | 0 | 0 | 1 | 0 | 0 | 1 | 0 | 0 |
| 162 | 1 0 1 0 0 0 1 0 | 0 | 1 | 0 | 0 | 0 | 1 | 0 | 0 | 0 | 1 | 0 | 0 | 0 | 0 | 0 | 0 |
| 163 | 1 0 1 0 0 0 1 1 | 0 | 0 | 0 | 0 | 0 | 1 | 0 | 0 | 1 | 0 | 0 | 0 | 0 | 1 | 0 | 0 |
| 164 | 1 0 1 0 0 1 0 0 | 0 | 1 | 0 | 0 | 0 | 1 | 0 | 0 | 0 | 0 | 1 | 0 | 0 | 1 | 0 | 0 |
| 165 | 1 0 1 0 0 1 0 1 | 0 | 0 | 0 | 0 | 0 | 1 | 0 | 0 | 0 | 0 | 1 | 0 | 0 | 1 | 0 | 0 |
| 166 | 1 0 1 0 0 1 1 0 | 0 | 1 | 0 | 0 | 0 | 0 | 0 | 1 | 0 | 0 | 0 | 0 | 1 | 0 | 0 | 0 |
| 167 | 1 0 1 0 0 1 1 1 | 0 | 0 | 1 | 0 | 0 | 1 | 0 | 0 | 0 | 0 | 1 | 0 | 0 | 1 | 0 | 0 |
| 168 | 1 0 1 0 1 0 0 0 | 0 | 1 | 0 | 0 | 1 | 0 | 0 | 1 | 0 | 0 | 1 | 0 | 0 | 1 | 0 | 0 |
| 169 | 1 0 1 0 1 0 0 1 | 1 | 0 | 0 | 0 | 0 | 0 | 0 | 1 | 0 | 0 | 1 | 0 | 0 | 1 | 0 | 0 |
| 170 | 1 0 1 0 1 0 1 0 | 1 | 0 | 0 | 1 | 0 | 0 | 0 | 1 | 0 | 0 | 1 | 0 | 0 | 1 | 0 | 0 |
| 171 | 1 0 1 0 1 0 1 1 | 1 | 0 | 0 | 0 | 1 | 0 | 0 | 1 | 0 | 0 | 1 | 0 | 0 | 1 | 0 | 0 |
| 172 | 1 0 1 0 1 1 0 0 | 0 | 1 | 0 | 0 | 0 | 0 | 0 | 1 | 0 | 0 | 1 | 0 | 0 | 1 | 0 | 0 |
| 173 | 1 0 1 0 1 1 0 1 | 0 | 0 | 0 | 0 | 0 | 0 | 0 | 1 | 0 | 0 | 1 | 0 | 0 | 1 | 0 | 0 |
| 174 | 1 0 1 0 1 1 1 0 | 0 | 0 | 0 | 1 | 0 | 0 | 0 | 1 | 0 | 0 | 1 | 0 | 0 | 1 | 0 | 0 |
| 175 | 1 0 1 0 1 1 1 1 | 0 | 0 | 1 | 0 | 0 | 0 | 0 | 1 | 0 | 0 | 1 | 0 | 0 | 1 | 0 | 0 |
| 176 | 1 0 1 1 0 0 0 0 | 0 | 0 | 0 | 0 | 0 | 1 | 0 | 0 | 1 | 0 | 0 | 0 | 0 | 0 | 0 | 0 |
| 177 | 1 0 1 1 0 0 0 1 | 1 | 0 | 0 | 0 | 0 | 0 | 1 | 0 | 0 | 0 | 1 | 0 | 0 | 1 | 0 | 0 |
| 178 | 1 0 1 1 0 0 1 0 | 1 | 0 | 0 | 1 | 0 | 0 | 1 | 0 | 0 | 0 | 1 | 0 | 0 | 1 | 0 | 0 |
| 179 | 1 0 1 1 0 0 1 1 | 0 | 0 | 1 | 0 | 0 | 1 | 0 | 0 | 0 | 1 | 0 | 0 | 0 | 0 | 0 | 0 |
| 180 | 1 0 1 1 0 1 0 0 | 0 | 1 | 0 | 0 | 0 | 0 | 1 | 0 | 0 | 0 | 1 | 0 | 0 | 1 | 0 | 0 |
| 181 | 1 0 1 1 0 1 0 1 | 0 | 0 | 0 | 0 | 0 | 0 | 1 | 0 | 0 | 0 | 1 | 0 | 0 | 1 | 0 | 0 |
| 182 | 1 0 1 1 0 1 1 0 | 0 | 0 | 0 | 1 | 0 | 0 | 1 | 0 | 0 | 0 | 1 | 0 | 0 | 1 | 0 | 0 |
| 183 | 1 0 1 1 0 1 1 1 | 0 | 0 | 1 | 0 | 0 | 0 | 1 | 0 | 0 | 0 | 1 | 0 | 0 | 1 | 0 | 0 |
| 184 | 1 0 1 1 1 0 0 0 | 0 | 1 | 0 | 0 | 1 | 0 | 0 | 0 | 0 | 0 | 1 | 0 | 0 | 1 | 0 | 0 |
| 185 | 1 0 1 1 1 0 0 1 | 1 | 0 | 0 | 0 | 0 | 0 | 0 | 0 | 0 | 0 | 1 | 0 | 0 | 1 | 0 | 0 |
| 186 | 1 0 1 1 1 0 1 0 | 1 | 0 | 0 | 1 | 0 | 0 | 0 | 0 | 0 | 0 | 1 | 0 | 0 | 1 | 0 | 0 |
| 187 | 1 0 1 1 1 0 1 1 | 1 | 0 | 0 | 0 | 1 | 0 | 0 | 0 | 0 | 0 | 1 | 0 | 0 | 1 | 0 | 0 |
| 188 | 1 0 1 1 1 1 0 0 | 0 | 1 | 0 | 0 | 0 | 0 | 0 | 0 | 0 | 0 | 1 | 0 | 0 | 1 | 0 | 0 |
| 189 | 1 0 1 1 1 1 0 1 | 0 | 0 | 0 | 1 | 0 | 0 | 0 | 0 | 0 | 0 | 1 | 0 | 0 | 1 | 0 | 0 |
| 190 | 1 0 1 1 1 1 1 0 | 0 | 0 | 0 | 1 | 0 | 0 | 0 | 0 | 0 | 0 | 1 | 0 | 0 | 1 | 0 | 0 |
| 191 | 1 0 1 1 1 1 1 1 | 0 | 0 | 1 | 0 | 0 | 0 | 0 | 0 | 0 | 0 | 1 | 0 | 0 | 1 | 0 | 0 |

Fig. 2G

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 c15 c16 |
| 192 | 1 1 0 0 0 0 0 0 | 0 1 0 0 0 1 0 0 1 0 0 0 0 0 0 0 |
| 193 | 1 1 0 0 0 0 0 1 | 1 0 0 0 0 1 0 0 0 1 0 0 0 1 0 0 |
| 194 | 1 1 0 0 0 0 1 0 | 1 0 0 1 0 0 1 0 0 1 0 0 0 0 0 0 |
| 195 | 1 1 0 0 0 0 1 1 | 0 0 0 0 1 0 0 0 1 0 0 1 0 0 0 0 |
| 196 | 1 1 0 0 0 1 0 0 | 0 1 0 0 0 1 0 0 0 1 0 0 0 1 0 0 |
| 197 | 1 1 0 0 0 1 0 1 | 0 0 0 0 0 1 0 0 0 1 0 0 0 1 0 0 |
| 198 | 1 1 0 0 0 1 1 0 | 0 0 0 1 0 0 1 0 0 1 0 0 0 0 0 0 |
| 199 | 1 1 0 0 0 1 1 1 | 0 0 1 0 0 1 0 0 0 1 0 0 0 1 0 0 |
| 200 | 1 1 0 0 1 0 0 0 | 0 0 0 0 1 0 0 1 0 0 0 0 0 1 0 0 |
| 201 | 1 1 0 0 1 0 0 1 | 1 0 0 0 0 1 0 0 0 0 0 0 0 1 0 0 |
| 202 | 1 1 0 0 1 0 1 0 | 0 0 0 0 1 0 0 1 0 0 0 1 0 0 0 0 |
| 203 | 1 1 0 0 1 0 1 1 | 0 0 0 0 1 0 0 1 0 0 0 0 0 0 0 0 |
| 204 | 1 1 0 0 1 1 0 0 | 0 1 0 0 0 1 0 0 0 0 0 0 0 1 0 0 |
| 205 | 1 1 0 0 1 1 0 1 | 0 0 0 0 0 1 0 0 0 0 0 0 0 1 0 0 |
| 206 | 1 1 0 0 1 1 1 0 | 0 0 0 0 0 0 1 0 0 1 0 0 0 0 0 0 |
| 207 | 1 1 0 0 1 1 1 1 | 0 0 1 0 0 1 0 0 0 0 0 0 0 1 0 0 |
| 208 | 1 1 0 1 0 0 0 0 | 0 0 0 0 0 1 0 0 1 0 0 1 0 0 0 0 |
| 209 | 1 1 0 1 0 0 0 1 | 1 0 0 0 0 0 1 0 0 1 0 0 0 1 0 0 |
| 210 | 1 1 0 1 0 0 1 0 | 1 0 0 1 0 0 1 0 0 1 0 0 0 1 0 0 |
| 211 | 1 1 0 1 0 0 1 1 | 1 0 0 0 0 1 0 0 1 0 0 0 0 0 0 0 |
| 212 | 1 1 0 1 0 1 0 0 | 0 1 0 0 0 0 1 0 0 1 0 0 0 1 0 0 |
| 213 | 1 1 0 1 0 1 0 1 | 0 0 0 0 0 0 1 0 0 1 0 0 0 1 0 0 |
| 214 | 1 1 0 1 0 1 1 0 | 0 0 0 1 0 0 1 0 0 1 0 0 0 1 0 0 |
| 215 | 1 1 0 1 0 1 1 1 | 0 0 1 0 0 0 1 0 0 1 0 0 0 1 0 0 |
| 216 | 1 1 0 1 1 0 0 0 | 0 1 0 0 1 0 0 0 1 0 0 0 0 1 0 0 |
| 217 | 1 1 0 1 1 0 0 1 | 1 0 0 0 0 0 0 0 1 0 0 0 0 1 0 0 |
| 218 | 1 1 0 1 1 0 1 0 | 1 0 0 1 0 0 0 0 1 0 0 0 0 1 0 0 |
| 219 | 1 1 0 1 1 0 1 1 | 1 0 0 0 1 0 0 0 1 0 0 0 0 1 0 0 |
| 220 | 1 1 0 1 1 1 0 0 | 0 1 0 0 0 0 0 0 1 0 0 0 0 1 0 0 |
| 221 | 1 1 0 1 1 1 0 1 | 0 0 0 0 1 0 0 0 0 1 0 0 0 1 0 0 |
| 222 | 1 1 0 1 1 1 1 0 | 0 0 0 1 0 0 0 0 1 0 0 0 0 1 0 0 |
| 223 | 1 1 0 1 1 1 1 1 | 0 0 1 0 0 0 0 0 1 0 0 0 0 1 0 0 |

Fig. 2H

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 c15 c16 |
| 224 | 1 1 1 0 0 0 0 0 | 0 1 0 0 0 1 0 0 0 0 0 0 1 0 0 0 |
| 225 | 1 1 1 0 0 0 0 1 | 0 0 0 0 0 1 0 0 0 0 0 1 0 0 0 0 |
| 226 | 1 1 1 0 0 0 1 0 | 1 0 0 0 0 1 0 0 0 1 0 0 1 0 0 0 |
| 227 | 1 1 1 0 0 0 1 1 | 0 0 1 0 0 1 0 0 0 0 0 1 0 0 0 0 |
| 228 | 1 1 1 0 0 1 0 0 | 0 1 0 0 0 1 0 0 0 1 0 0 1 0 0 0 |
| 229 | 1 1 1 0 0 1 0 1 | 0 0 0 0 0 1 0 0 1 0 0 1 0 0 0 0 |
| 230 | 1 1 1 0 0 1 1 0 | 0 1 0 0 0 0 0 1 0 0 0 1 0 0 0 0 |
| 231 | 1 1 1 0 0 1 1 1 | 0 0 1 0 0 1 0 0 0 1 0 0 1 0 0 0 |
| 232 | 1 1 1 0 1 0 0 0 | 1 0 0 0 0 1 0 0 0 0 0 1 0 0 0 0 |
| 233 | 1 1 1 0 1 0 0 1 | 1 0 0 0 0 1 0 0 0 0 1 0 0 0 0 0 |
| 234 | 1 1 1 0 1 0 1 0 | 0 0 0 0 1 0 0 1 0 0 1 0 0 1 0 0 |
| 235 | 1 1 1 0 1 0 1 1 | 0 0 0 0 1 0 0 1 0 0 0 1 0 0 0 0 |
| 236 | 1 1 1 0 1 1 0 0 | 0 1 0 0 0 1 0 0 0 0 1 0 0 0 0 0 |
| 237 | 1 1 1 0 1 1 0 1 | 0 0 0 0 0 1 0 0 0 0 1 0 0 0 0 0 |
| 238 | 1 1 1 0 1 1 1 0 | 0 0 0 1 0 0 0 1 0 0 0 1 0 0 0 0 |
| 239 | 1 1 1 0 1 1 1 1 | 0 0 1 0 0 1 0 0 0 0 1 0 0 0 0 0 |
| 240 | 1 1 1 1 0 0 0 0 | 0 0 0 0 0 1 0 0 1 0 0 1 0 0 0 0 |
| 241 | 1 1 1 1 0 0 0 1 | 1 0 0 0 0 0 1 0 0 1 0 0 1 0 0 0 |
| 242 | 1 1 1 1 0 0 1 0 | 1 0 0 1 0 0 1 0 0 1 0 0 1 0 0 0 |
| 243 | 1 1 1 1 0 0 1 1 | 0 0 0 0 1 0 0 0 1 0 0 1 0 0 0 0 |
| 244 | 1 1 1 1 0 1 0 0 | 0 1 0 0 0 0 1 0 0 1 0 0 1 0 0 0 |
| 245 | 1 1 1 1 0 1 0 1 | 0 0 0 0 0 0 1 0 0 1 0 0 1 0 0 0 |
| 246 | 1 1 1 1 0 1 1 0 | 0 0 0 1 0 0 1 0 0 1 0 0 1 0 0 0 |
| 247 | 1 1 1 1 0 1 1 1 | 0 0 1 0 0 0 1 0 0 1 0 0 1 0 0 0 |
| 248 | 1 1 1 1 1 0 0 0 | 0 1 0 0 1 0 0 0 0 1 0 0 1 0 0 0 |
| 249 | 1 1 1 1 1 0 0 1 | 1 0 0 0 0 0 0 0 1 0 0 1 0 0 0 0 |
| 250 | 1 1 1 1 1 0 1 0 | 1 0 0 1 0 0 0 0 0 1 0 0 1 0 0 0 |
| 251 | 1 1 1 1 1 0 1 1 | 1 0 0 0 1 0 0 0 0 1 0 0 1 0 0 0 |
| 252 | 1 1 1 1 1 1 0 0 | 0 1 0 0 0 0 0 0 1 0 0 1 0 0 0 0 |
| 253 | 1 1 1 1 1 1 0 1 | 0 0 0 0 1 0 0 0 0 1 0 0 1 0 0 0 |
| 254 | 1 1 1 1 1 1 1 0 | 0 0 0 1 0 0 0 0 1 0 0 1 0 0 0 0 |
| 255 | 1 1 1 1 1 1 1 1 | 0 0 1 0 0 0 0 0 1 0 0 1 0 0 0 0 |

Fig. 4A

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 0  | 0 0 0 0 0 0 0 0 | 0 1 0 0 1 0 0 0 1 0 0 0 0 0 |
| 1  | 0 0 0 0 0 0 0 1 | 1 0 0 0 0 1 0 0 0 0 0 0 0 0 |
| 2  | 0 0 0 0 0 0 1 0 | 1 0 0 1 0 0 0 0 1 0 0 0 0 0 |
| 3  | 0 0 0 0 0 0 1 1 | 1 0 0 0 1 0 0 0 1 0 0 0 0 0 |
| 4  | 0 0 0 0 0 1 0 0 | 0 1 0 0 0 1 0 0 0 0 0 0 0 0 |
| 5  | 0 0 0 0 0 1 0 1 | 0 0 0 0 0 1 0 0 1 0 0 0 0 0 |
| 6  | 0 0 0 0 0 1 1 0 | 0 0 0 1 0 0 0 1 0 0 0 0 0 0 |
| 7  | 0 0 0 0 0 1 1 1 | 0 0 1 0 0 1 0 0 0 0 0 0 0 0 |
| 8  | 0 0 0 0 1 0 0 0 | 0 1 0 0 1 0 0 1 0 0 0 0 0 0 |
| 9  | 0 0 0 0 1 0 0 1 | 1 0 0 0 0 0 1 0 0 0 0 0 0 0 |
| 10 | 0 0 0 0 1 0 1 0 | 1 0 0 1 0 0 1 0 0 0 0 0 0 0 |
| 11 | 0 0 0 0 1 0 1 1 | 1 0 0 0 1 0 0 1 0 0 0 0 0 0 |
| 12 | 0 0 0 0 1 1 0 0 | 0 1 0 0 0 0 1 0 0 0 0 0 0 0 |
| 13 | 0 0 0 0 1 1 0 1 | 0 0 0 0 0 0 1 0 0 0 0 0 0 0 |
| 14 | 0 0 0 0 1 1 1 0 | 0 0 0 1 0 0 1 0 0 0 0 0 0 0 |
| 15 | 0 0 0 0 1 1 1 1 | 0 0 1 0 0 0 1 0 0 0 0 0 0 0 |
| 16 | 0 0 0 1 0 0 0 0 | 1 0 0 0 0 0 0 1 0 0 0 0 0 0 |
| 17 | 0 0 0 1 0 0 0 1 | 1 0 0 0 0 1 0 0 0 0 0 0 0 0 |
| 18 | 0 0 0 1 0 0 1 0 | 1 0 0 1 0 0 1 0 0 0 0 0 0 0 |
| 19 | 0 0 0 1 0 0 1 1 | 0 0 1 0 0 0 0 1 0 0 0 0 0 0 |
| 20 | 0 0 0 1 0 1 0 0 | 0 1 0 0 0 1 0 0 0 0 0 0 0 0 |
| 21 | 0 0 0 1 0 1 0 1 | 0 0 0 0 0 1 0 0 0 0 0 0 0 0 |
| 22 | 0 0 0 1 0 1 1 0 | 0 0 0 1 0 1 0 0 0 0 0 0 0 0 |
| 23 | 0 0 0 1 0 1 1 1 | 0 0 1 0 0 1 0 0 0 0 0 0 0 0 |
| 24 | 0 0 0 1 1 0 0 0 | 0 1 0 0 1 0 0 0 1 0 0 0 0 0 |
| 25 | 0 0 0 1 1 0 0 1 | 1 0 0 0 0 0 0 0 1 0 0 0 0 0 |
| 26 | 0 0 0 1 1 0 1 0 | 1 0 0 1 0 0 0 0 1 0 0 0 0 0 |
| 27 | 0 0 0 1 1 0 1 1 | 1 0 0 0 1 0 0 0 1 0 0 0 0 0 |
| 28 | 0 0 0 1 1 1 0 0 | 0 1 0 0 0 0 0 0 1 0 0 0 0 0 |
| 29 | 0 0 0 1 1 1 0 1 | 0 0 0 0 1 0 0 0 1 0 0 0 0 0 |
| 30 | 0 0 0 1 1 1 1 0 | 0 0 0 1 0 0 0 0 1 0 0 0 0 0 |
| 31 | 0 0 0 1 1 1 1 1 | 0 0 1 0 0 0 0 0 1 0 0 0 0 0 |

Fig. 4B

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 32 | 0 0 1 0 0 0 0 0 | 0 0 0 0 0 0 0 1 0 0 0 0 0 0 |
| 33 | 0 0 1 0 0 0 0 1 | 1 0 0 0 0 1 0 0 0 0 1 0 0 0 |
| 34 | 0 0 1 0 0 0 1 0 | 0 0 0 0 1 0 0 1 0 0 0 0 0 0 |
| 35 | 0 0 1 0 0 0 1 1 | 0 0 1 0 0 1 0 0 1 0 0 0 0 0 |
| 36 | 0 0 1 0 0 1 0 0 | 0 1 0 0 0 1 0 0 0 0 1 0 0 0 |
| 37 | 0 0 1 0 0 1 0 1 | 0 0 0 0 0 1 0 0 0 0 1 0 0 0 |
| 38 | 0 0 1 0 0 1 1 0 | 0 1 0 0 0 0 0 1 0 0 0 0 0 0 |
| 39 | 0 0 1 0 0 1 1 1 | 0 0 1 0 0 1 0 0 0 0 1 0 0 0 |
| 40 | 0 0 1 0 1 0 0 0 | 0 1 0 0 1 0 0 1 0 0 1 0 0 0 |
| 41 | 0 0 1 0 1 0 0 1 | 1 0 0 0 0 0 1 0 0 1 0 0 0 0 |
| 42 | 0 0 1 0 1 0 1 0 | 1 0 0 1 0 0 0 1 0 0 1 0 0 0 |
| 43 | 0 0 1 0 1 0 1 1 | 1 0 0 0 1 0 0 1 0 0 1 0 0 0 |
| 44 | 0 0 1 0 1 1 0 0 | 0 1 0 0 0 0 0 1 0 0 1 0 0 0 |
| 45 | 0 0 1 0 1 1 0 1 | 0 0 0 0 0 0 0 1 0 0 1 0 0 0 |
| 46 | 0 0 1 0 1 1 1 0 | 0 0 0 1 0 0 0 1 0 0 1 0 0 0 |
| 47 | 0 0 1 0 1 1 1 1 | 0 0 1 0 0 0 1 0 0 1 0 0 0 0 |
| 48 | 0 0 1 1 0 0 0 0 | 0 0 0 0 0 1 0 0 0 0 0 0 0 0 |
| 49 | 0 0 1 1 0 0 0 1 | 1 0 0 0 0 0 1 0 0 0 1 0 0 0 |
| 50 | 0 0 1 1 0 0 1 0 | 1 0 0 1 0 0 1 0 0 0 1 0 0 0 |
| 51 | 0 0 1 1 0 0 1 1 | 1 0 0 0 0 1 0 0 0 1 0 0 0 0 |
| 52 | 0 0 1 1 0 1 0 0 | 0 1 0 0 0 0 1 0 0 0 1 0 0 0 |
| 53 | 0 0 1 1 0 1 0 1 | 0 0 0 0 0 0 1 0 0 0 1 0 0 0 |
| 54 | 0 0 1 1 0 1 1 0 | 0 0 0 1 0 0 1 0 0 0 1 0 0 0 |
| 55 | 0 0 1 1 0 1 1 1 | 0 0 1 0 0 1 0 0 0 0 1 0 0 0 |
| 56 | 0 0 1 1 1 0 0 0 | 0 1 0 0 1 0 0 0 0 0 1 0 0 0 |
| 57 | 0 0 1 1 1 0 0 1 | 1 0 0 0 0 0 0 0 0 1 0 0 0 0 |
| 58 | 0 0 1 1 1 0 1 0 | 1 0 0 1 0 0 0 0 0 1 0 0 0 0 |
| 59 | 0 0 1 1 1 0 1 1 | 1 0 0 0 1 0 0 0 0 1 0 0 0 0 |
| 60 | 0 0 1 1 1 1 0 0 | 0 1 0 0 0 0 0 0 0 1 0 0 0 0 |
| 61 | 0 0 1 1 1 1 0 1 | 0 0 0 0 1 0 0 0 0 1 0 0 0 0 |
| 62 | 0 0 1 1 1 1 1 0 | 0 0 0 1 0 0 0 0 0 1 0 0 0 0 |
| 63 | 0 0 1 1 1 1 1 1 | 0 0 1 0 0 0 0 0 0 1 0 0 0 0 |

Fig. 4C

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 64 | 0 1 0 0 0 0 0 0 | 0 1 0 0 1 0 0 0 1 0 0 1 0 0 |
| 65 | 0 1 0 0 0 0 0 1 | 1 0 0 0 0 1 0 0 1 0 0 1 0 0 |
| 66 | 0 1 0 0 0 0 1 0 | 1 0 0 1 0 0 0 0 1 0 0 1 0 0 |
| 67 | 0 1 0 0 0 0 1 1 | 1 0 0 0 1 0 0 0 1 0 0 1 0 0 |
| 68 | 0 1 0 0 0 1 0 0 | 0 1 0 0 1 0 0 1 0 0 1 0 0 |
| 69 | 0 1 0 0 0 1 0 1 | 0 0 0 0 0 0 0 1 0 0 1 0 0 |
| 70 | 0 1 0 0 0 1 1 0 | 0 0 0 1 0 0 0 1 0 0 1 0 0 |
| 71 | 0 1 0 0 0 1 1 1 | 0 0 1 0 0 1 0 0 1 0 0 1 0 0 |
| 72 | 0 1 0 0 1 0 0 0 | 0 1 0 0 1 0 0 1 0 0 0 1 0 0 |
| 73 | 0 1 0 0 1 0 0 1 | 1 0 0 0 0 0 0 1 0 0 0 1 0 0 |
| 74 | 0 1 0 0 1 0 1 0 | 1 0 0 1 0 0 0 1 0 0 0 1 0 0 |
| 75 | 0 1 0 0 1 0 1 1 | 1 0 0 0 1 0 0 1 0 0 0 1 0 0 |
| 76 | 0 1 0 0 1 1 0 0 | 0 1 0 0 0 0 0 1 0 0 0 1 0 0 |
| 77 | 0 1 0 0 1 1 0 1 | 0 0 0 0 0 0 1 0 0 0 1 0 0 |
| 78 | 0 1 0 0 1 1 1 0 | 0 0 0 1 0 0 0 1 0 0 0 1 0 0 |
| 79 | 0 1 0 0 1 1 1 1 | 0 0 1 0 0 0 0 1 0 0 0 1 0 0 |
| 80 | 0 1 0 1 0 0 0 0 | 1 0 0 0 0 0 0 0 1 0 0 1 0 0 |
| 81 | 0 1 0 1 0 0 0 1 | 1 0 0 0 0 0 1 0 0 0 0 1 0 0 |
| 82 | 0 1 0 1 0 0 1 0 | 1 0 0 1 0 0 1 0 0 0 0 1 0 0 |
| 83 | 0 1 0 1 0 0 1 1 | 0 0 1 0 0 0 0 1 0 0 0 1 0 0 |
| 84 | 0 1 0 1 0 1 0 0 | 0 1 0 0 0 0 1 0 0 0 0 1 0 0 |
| 85 | 0 1 0 1 0 1 0 1 | 0 0 0 0 0 1 0 0 0 0 1 0 0 |
| 86 | 0 1 0 1 0 1 1 0 | 0 0 0 1 0 0 1 0 0 0 0 1 0 0 |
| 87 | 0 1 0 1 0 1 1 1 | 0 0 1 0 0 0 1 0 0 0 0 1 0 0 |
| 88 | 0 1 0 1 1 0 0 0 | 0 1 0 0 1 0 0 0 0 0 0 1 0 0 |
| 89 | 0 1 0 1 1 0 0 1 | 1 0 0 0 0 0 0 0 0 0 0 1 0 0 |
| 90 | 0 1 0 1 1 0 1 0 | 1 0 0 1 0 0 0 0 0 0 0 1 0 0 |
| 91 | 0 1 0 1 1 0 1 1 | 1 0 0 0 1 0 0 0 0 0 0 1 0 0 |
| 92 | 0 1 0 1 1 1 0 0 | 0 1 0 0 0 0 0 0 0 0 0 1 0 0 |
| 93 | 0 1 0 1 1 1 0 1 | 0 0 0 0 1 0 0 0 0 0 0 1 0 0 |
| 94 | 0 1 0 1 1 1 1 0 | 0 0 0 1 0 0 0 0 0 0 0 1 0 0 |
| 95 | 0 1 0 1 1 1 1 1 | 0 0 1 0 0 0 0 0 0 0 0 1 0 0 |

Fig. 4D

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 96  | 0 1 1 0 0 0 0 0 | 0 1 0 0 1 0 0 0 1 0 0 0 1 0 |
| 97  | 0 1 1 0 0 0 0 1 | 1 0 0 0 0 1 0 0 1 0 0 0 1 0 |
| 98  | 0 1 1 0 0 0 1 0 | 1 0 0 1 0 0 0 0 1 0 0 0 1 0 |
| 99  | 0 1 1 0 0 0 1 1 | 1 0 0 0 1 0 0 0 1 0 0 0 1 0 |
| 100 | 0 1 1 0 0 1 0 0 | 0 1 0 0 0 1 0 0 1 0 0 0 1 0 |
| 101 | 0 1 1 0 0 1 0 1 | 0 0 0 0 0 0 0 0 1 0 0 0 1 0 |
| 102 | 0 1 1 0 0 1 1 0 | 0 1 0 0 0 0 0 0 1 0 0 1 0 0 |
| 103 | 0 1 1 0 0 1 1 1 | 0 0 1 0 0 1 0 0 1 0 0 0 1 0 |
| 104 | 0 1 1 0 1 0 0 0 | 0 1 0 0 1 0 0 1 0 0 0 0 1 0 |
| 105 | 0 1 1 0 1 0 0 1 | 1 0 0 0 0 0 0 1 0 0 0 0 1 0 |
| 106 | 0 1 1 0 1 0 1 0 | 1 0 0 1 0 0 0 1 0 0 0 0 1 0 |
| 107 | 0 1 1 0 1 0 1 1 | 1 0 0 0 1 0 0 1 0 0 0 0 1 0 |
| 108 | 0 1 1 0 1 1 0 0 | 0 1 0 0 0 0 1 0 0 0 0 0 1 0 |
| 109 | 0 1 1 0 1 1 0 1 | 0 0 0 0 0 0 1 0 0 0 0 0 1 0 |
| 110 | 0 1 1 0 1 1 1 0 | 0 0 0 1 0 0 1 0 0 0 0 0 1 0 |
| 111 | 0 1 1 0 1 1 1 1 | 0 0 1 0 0 0 1 0 0 0 0 0 1 0 |
| 112 | 0 1 1 1 0 0 0 0 | 1 0 0 0 0 0 0 1 0 0 0 0 1 0 |
| 113 | 0 1 1 1 0 0 0 1 | 1 0 0 0 0 1 0 0 0 0 0 0 1 0 |
| 114 | 0 1 1 1 0 0 1 0 | 1 0 0 1 0 0 1 0 0 0 0 0 1 0 |
| 115 | 0 1 1 1 0 0 1 1 | 0 0 1 0 0 0 0 1 0 0 0 0 1 0 |
| 116 | 0 1 1 1 0 1 0 0 | 0 1 0 0 0 1 0 0 0 0 0 0 1 0 |
| 117 | 0 1 1 1 0 1 0 1 | 0 0 0 0 0 1 0 0 0 0 0 0 1 0 |
| 118 | 0 1 1 1 0 1 1 0 | 0 0 0 1 0 0 1 0 0 0 0 0 1 0 |
| 119 | 0 1 1 1 0 1 1 1 | 0 0 1 0 0 1 0 0 0 0 0 0 1 0 |
| 120 | 0 1 1 1 1 0 0 0 | 0 1 0 0 1 0 0 0 0 0 0 0 1 0 |
| 121 | 0 1 1 1 1 0 0 1 | 0 0 0 0 1 0 0 1 0 0 1 0 0 0 |
| 122 | 0 1 1 1 1 0 1 0 | 1 0 0 1 0 0 0 0 0 0 0 0 1 0 |
| 123 | 0 1 1 1 1 0 1 1 | 1 0 0 0 1 0 0 0 0 0 0 0 1 0 |
| 124 | 0 1 1 1 1 1 0 0 | 0 1 0 0 0 0 0 0 0 0 0 0 1 0 |
| 125 | 0 1 1 1 1 1 0 1 | 0 0 0 0 1 0 0 0 0 0 0 0 1 0 |
| 126 | 0 1 1 1 1 1 1 0 | 0 0 0 1 0 0 0 0 0 0 0 0 1 0 |
| 127 | 0 1 1 1 1 1 1 1 | 0 0 1 0 0 0 0 0 0 0 0 0 1 0 |

Fig. 4E

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 128 | 1 0 0 0 0 0 0 0 | 0 1 0 0 1 0 0 1 0 0 0 0 0 1 |
| 129 | 1 0 0 0 0 0 0 1 | 1 0 0 0 0 1 0 0 1 0 0 0 0 1 |
| 130 | 1 0 0 0 0 0 1 0 | 1 0 0 1 0 0 0 0 1 0 0 0 0 1 |
| 131 | 1 0 0 0 0 0 1 1 | 1 0 0 0 1 0 0 0 1 0 0 0 0 1 |
| 132 | 1 0 0 0 0 1 0 0 | 0 1 0 0 0 1 0 0 1 0 0 0 0 1 |
| 133 | 1 0 0 0 0 1 0 1 | 0 0 0 0 0 0 0 0 1 0 0 0 0 1 |
| 134 | 1 0 0 0 0 1 1 0 | 0 0 0 1 0 0 0 0 1 0 0 0 0 1 |
| 135 | 1 0 0 0 0 1 1 1 | 0 0 1 0 0 1 0 0 1 0 0 0 0 1 |
| 136 | 1 0 0 0 1 0 0 0 | 0 1 0 0 1 0 0 1 0 0 0 0 0 1 |
| 137 | 1 0 0 0 1 0 0 1 | 1 0 0 0 0 0 0 1 0 0 0 0 0 1 |
| 138 | 1 0 0 0 1 0 1 0 | 1 0 0 1 0 0 0 1 0 0 0 0 0 1 |
| 139 | 1 0 0 0 1 0 1 1 | 1 0 0 0 1 0 0 1 0 0 0 0 0 1 |
| 140 | 1 0 0 0 1 1 0 0 | 0 1 0 0 0 0 0 1 0 0 0 0 0 1 |
| 141 | 1 0 0 0 1 1 0 1 | 0 0 0 0 0 0 0 1 0 0 0 0 0 1 |
| 142 | 1 0 0 0 1 1 1 0 | 0 0 0 1 0 0 0 1 0 0 0 0 0 1 |
| 143 | 1 0 0 0 1 1 1 1 | 0 0 1 0 0 0 0 1 0 0 0 0 0 1 |
| 144 | 1 0 0 1 0 0 0 0 | 1 0 0 0 0 0 0 0 1 0 0 0 0 1 |
| 145 | 1 0 0 1 0 0 0 1 | 1 0 0 0 0 0 1 0 0 0 0 0 0 1 |
| 146 | 1 0 0 1 0 0 1 0 | 1 0 0 1 0 0 1 0 0 0 0 0 0 1 |
| 147 | 1 0 0 1 0 0 1 1 | 0 0 1 0 0 0 0 1 0 0 0 0 0 1 |
| 148 | 1 0 0 1 0 1 0 0 | 0 1 0 0 0 0 1 0 0 0 0 0 0 1 |
| 149 | 1 0 0 1 0 1 0 1 | 0 0 0 0 0 0 1 0 0 0 0 0 0 1 |
| 150 | 1 0 0 1 0 1 1 0 | 0 0 0 1 0 0 1 0 0 0 0 0 0 1 |
| 151 | 1 0 0 1 0 1 1 1 | 0 0 1 0 0 0 1 0 0 0 0 0 0 1 |
| 152 | 1 0 0 1 1 0 0 0 | 0 1 0 0 1 0 0 0 0 0 0 0 0 1 |
| 153 | 1 0 0 1 1 0 0 1 | 1 0 0 0 0 1 0 0 1 0 0 0 0 0 |
| 154 | 1 0 0 1 1 0 1 0 | 1 0 0 1 0 0 0 0 0 0 0 0 0 1 |
| 155 | 1 0 0 1 1 0 1 1 | 1 0 0 0 1 0 0 0 0 0 0 0 0 1 |
| 156 | 1 0 0 1 1 1 0 0 | 0 1 0 0 0 0 1 0 0 1 0 0 0 0 |
| 157 | 1 0 0 1 1 1 0 1 | 0 0 0 0 1 0 0 0 0 0 0 0 0 1 |
| 158 | 1 0 0 1 1 1 1 0 | 0 0 0 1 0 0 0 0 0 0 0 0 0 1 |
| 159 | 1 0 0 1 1 1 1 1 | 0 0 1 0 0 0 1 0 0 1 0 0 0 0 |

Fig. 4F

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 160 | 1 0 1 0 0 0 0 0 | 0 0 0 0 1 0 0 0 1 0 0 0 0 1 |
| 161 | 1 0 1 0 0 0 0 1 | 1 0 0 0 0 1 0 0 0 1 0 0 0 1 |
| 162 | 1 0 1 0 0 0 1 0 | 0 1 0 0 0 1 0 0 0 1 0 0 0 0 |
| 163 | 1 0 1 0 0 0 1 1 | 0 0 0 0 0 1 0 0 1 0 0 0 0 1 |
| 164 | 1 0 1 0 0 1 0 0 | 0 1 0 0 0 1 0 0 0 0 1 0 0 1 |
| 165 | 1 0 1 0 0 1 0 1 | 0 0 0 0 0 1 0 0 0 0 1 0 0 1 |
| 166 | 1 0 1 0 0 1 1 0 | 0 1 0 0 0 0 0 1 0 0 0 0 0 1 |
| 167 | 1 0 1 0 0 1 1 1 | 0 0 1 0 0 1 0 0 0 0 1 0 0 1 |
| 168 | 1 0 1 0 1 0 0 0 | 0 1 0 0 1 0 0 1 0 0 1 0 0 1 |
| 169 | 1 0 1 0 1 0 0 1 | 1 0 0 0 0 0 1 0 0 1 0 0 0 1 |
| 170 | 1 0 1 0 1 0 1 0 | 1 0 0 1 0 0 0 1 0 0 1 0 0 1 |
| 171 | 1 0 1 0 1 0 1 1 | 1 0 0 0 1 0 0 1 0 0 1 0 0 1 |
| 172 | 1 0 1 0 1 1 0 0 | 0 1 0 0 0 0 0 1 0 0 1 0 0 1 |
| 173 | 1 0 1 0 1 1 0 1 | 0 0 0 0 0 0 0 1 0 0 1 0 0 1 |
| 174 | 1 0 1 0 1 1 1 0 | 0 0 0 1 0 0 0 1 0 0 1 0 0 1 |
| 175 | 1 0 1 0 1 1 1 1 | 0 0 1 0 0 0 0 1 0 0 1 0 0 1 |
| 176 | 1 0 1 1 0 0 0 0 | 0 0 0 0 1 0 0 1 0 0 0 0 0 0 |
| 177 | 1 0 1 1 0 0 0 1 | 1 0 0 0 0 1 0 0 0 1 0 0 0 1 |
| 178 | 1 0 1 1 0 0 1 0 | 1 0 0 1 0 0 1 0 0 0 1 0 0 1 |
| 179 | 1 0 1 1 0 0 1 1 | 0 0 1 0 0 1 0 0 0 1 0 0 0 0 |
| 180 | 1 0 1 1 0 1 0 0 | 0 1 0 0 0 0 1 0 0 0 1 0 0 1 |
| 181 | 1 0 1 1 0 1 0 1 | 0 0 0 0 0 0 1 0 0 0 1 0 0 1 |
| 182 | 1 0 1 1 0 1 1 0 | 0 0 0 1 0 0 1 0 0 0 1 0 0 1 |
| 183 | 1 0 1 1 0 1 1 1 | 0 0 1 0 0 0 1 0 0 0 1 0 0 1 |
| 184 | 1 0 1 1 1 0 0 0 | 0 1 0 0 1 0 0 0 0 0 1 0 0 1 |
| 185 | 1 0 1 1 1 0 0 1 | 1 0 0 0 0 0 0 0 0 0 1 0 0 1 |
| 186 | 1 0 1 1 1 0 1 0 | 1 0 0 1 0 0 0 0 0 0 1 0 0 1 |
| 187 | 1 0 1 1 1 0 1 1 | 1 0 0 0 1 0 0 0 0 0 1 0 0 1 |
| 188 | 1 0 1 1 1 1 0 0 | 0 1 0 0 0 0 0 0 0 0 1 0 0 1 |
| 189 | 1 0 1 1 1 1 0 1 | 0 0 0 0 1 0 0 0 0 0 1 0 0 1 |
| 190 | 1 0 1 1 1 1 1 0 | 0 0 0 1 0 0 0 0 0 0 1 0 0 1 |
| 191 | 1 0 1 1 1 1 1 1 | 0 0 1 0 0 0 0 0 0 0 1 0 0 1 |

Fig. 4G

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 192 | 1 1 0 0 0 0 0 0 | 0 1 0 0 0 1 0 0 1 0 0 0 0 0 |
| 193 | 1 1 0 0 0 0 0 1 | 1 0 0 0 0 1 0 0 0 1 0 0 0 1 |
| 194 | 1 1 0 0 0 0 1 0 | 1 0 0 1 0 0 1 0 0 1 0 0 0 0 |
| 195 | 1 1 0 0 0 0 1 1 | 0 0 0 0 1 0 0 0 1 0 0 1 0 0 |
| 196 | 1 1 0 0 0 1 0 0 | 0 1 0 0 0 1 0 0 0 1 0 0 0 1 |
| 197 | 1 1 0 0 0 1 0 1 | 0 0 0 0 0 1 0 0 0 1 0 0 0 1 |
| 198 | 1 1 0 0 0 1 1 0 | 0 0 0 1 0 0 1 0 0 1 0 0 0 0 |
| 199 | 1 1 0 0 0 1 1 1 | 0 0 1 0 0 1 0 0 0 1 0 0 0 1 |
| 200 | 1 1 0 0 1 0 0 0 | 0 0 0 0 1 0 0 1 0 0 0 0 0 1 |
| 201 | 1 1 0 0 1 0 0 1 | 1 0 0 0 0 1 0 0 0 0 0 0 0 1 |
| 202 | 1 1 0 0 1 0 1 0 | 0 0 0 0 1 0 0 1 0 0 0 1 0 0 |
| 203 | 1 1 0 0 1 0 1 1 | 0 0 0 0 1 0 0 1 0 0 0 0 0 0 |
| 204 | 1 1 0 0 1 1 0 0 | 0 1 0 0 0 1 0 0 0 0 0 0 0 1 |
| 205 | 1 1 0 0 1 1 0 1 | 0 0 0 0 0 1 0 0 0 0 0 0 0 1 |
| 206 | 1 1 0 0 1 1 1 0 | 0 0 0 0 0 0 1 0 0 1 0 0 0 0 |
| 207 | 1 1 0 0 1 1 1 1 | 0 0 1 0 0 1 0 0 0 0 0 0 0 1 |
| 208 | 1 1 0 1 0 0 0 0 | 0 0 0 0 0 1 0 0 1 0 0 1 0 0 |
| 209 | 1 1 0 1 0 0 0 1 | 1 0 0 0 0 0 1 0 0 1 0 0 0 1 |
| 210 | 1 1 0 1 0 0 1 0 | 1 0 0 1 0 0 1 0 0 1 0 0 0 1 |
| 211 | 1 1 0 1 0 0 1 1 | 1 0 0 0 0 1 0 0 1 0 0 0 0 0 |
| 212 | 1 1 0 1 0 1 0 0 | 0 1 0 0 0 0 1 0 0 1 0 0 0 1 |
| 213 | 1 1 0 1 0 1 0 1 | 0 0 0 0 0 0 1 0 0 1 0 0 0 1 |
| 214 | 1 1 0 1 0 1 1 0 | 0 0 0 1 0 0 1 0 0 1 0 0 0 1 |
| 215 | 1 1 0 1 0 1 1 1 | 0 0 1 0 0 0 1 0 0 1 0 0 0 1 |
| 216 | 1 1 0 1 1 0 0 0 | 0 1 0 0 1 0 0 0 1 0 0 0 0 1 |
| 217 | 1 1 0 1 1 0 0 1 | 1 0 0 0 0 0 0 0 1 0 0 0 0 1 |
| 218 | 1 1 0 1 1 0 1 0 | 1 0 0 1 0 0 0 0 1 0 0 0 0 1 |
| 219 | 1 1 0 1 1 0 1 1 | 1 0 0 1 0 0 0 1 0 0 0 0 0 1 |
| 220 | 1 1 0 1 1 1 0 0 | 0 1 0 0 0 0 0 0 1 0 0 0 0 1 |
| 221 | 1 1 0 1 1 1 0 1 | 0 0 0 0 1 0 0 0 0 1 0 0 0 1 |
| 222 | 1 1 0 1 1 1 1 0 | 0 0 0 1 0 0 0 0 1 0 0 0 0 1 |
| 223 | 1 1 0 1 1 1 1 1 | 0 0 1 0 0 0 0 0 1 0 0 0 0 1 |

Fig. 4H

| | DATA BITS | CHANNEL BITS |
|---|---|---|
| | d1 d2 d3 d4 d5 d6 d7 d8 | c1 c2 c3 c4 c5 c6 c7 c8 c9 c10 c11 c12 c13 c14 |
| 224 | 1 1 1 0 0 0 0 0 | 0 1 0 0 0 1 0 0 0 0 0 0 1 0 |
| 225 | 1 1 1 0 0 0 0 1 | 0 0 0 0 0 1 0 0 0 0 0 0 1 0 |
| 226 | 1 1 1 0 0 0 1 0 | 1 0 0 0 0 1 0 0 1 0 0 0 1 0 |
| 227 | 1 1 1 0 0 0 1 1 | 0 0 1 0 0 1 0 0 0 0 0 0 1 0 |
| 228 | 1 1 1 0 0 1 0 0 | 0 1 0 0 0 1 0 0 0 1 0 0 1 0 |
| 229 | 1 1 1 0 0 1 0 1 | 0 0 0 0 0 1 0 0 0 1 0 0 1 0 |
| 230 | 1 1 1 0 0 1 1 0 | 0 1 0 0 0 0 0 1 0 0 0 0 1 0 |
| 231 | 1 1 1 0 0 1 1 1 | 0 0 1 0 0 1 0 0 0 1 0 0 1 0 |
| 232 | 1 1 1 0 1 0 0 0 | 1 0 0 0 0 1 0 0 0 0 0 0 1 0 |
| 233 | 1 1 1 0 1 0 0 1 | 1 0 0 0 0 1 0 0 0 0 1 0 0 0 |
| 234 | 1 1 1 0 1 0 1 0 | 0 0 0 0 1 0 0 1 0 0 1 0 0 1 |
| 235 | 1 1 1 0 1 0 1 1 | 0 0 0 0 1 0 0 1 0 0 0 0 1 0 |
| 236 | 1 1 1 0 1 1 0 0 | 0 1 0 0 0 1 0 0 0 0 0 1 0 0 |
| 237 | 1 1 1 0 1 1 0 1 | 0 0 0 0 0 1 0 0 0 0 0 1 0 0 |
| 238 | 1 1 1 0 1 1 1 0 | 0 0 0 1 0 0 0 0 1 0 0 0 1 0 |
| 239 | 1 1 1 0 1 1 1 1 | 0 0 1 0 0 1 0 0 0 0 0 1 0 0 |
| 240 | 1 1 1 1 0 0 0 0 | 0 0 0 0 0 1 0 0 1 0 0 0 1 0 |
| 241 | 1 1 1 1 0 0 0 1 | 1 0 0 0 0 0 1 0 0 1 0 0 1 0 |
| 242 | 1 1 1 1 0 0 1 0 | 1 0 0 1 0 0 1 0 0 1 0 0 1 0 |
| 243 | 1 1 1 1 0 0 1 1 | 0 0 0 0 1 0 0 0 1 0 0 0 1 0 |
| 244 | 1 1 1 1 0 1 0 0 | 0 1 0 0 0 0 1 0 0 1 0 0 1 0 |
| 245 | 1 1 1 1 0 1 0 1 | 0 0 0 0 0 0 1 0 0 1 0 0 1 0 |
| 246 | 1 1 1 1 0 1 1 0 | 0 0 0 1 0 0 1 0 0 1 0 0 1 0 |
| 247 | 1 1 1 1 0 1 1 1 | 0 0 1 0 0 0 1 0 0 1 0 0 1 0 |
| 248 | 1 1 1 1 1 0 0 0 | 0 1 0 0 1 0 0 0 0 1 0 0 1 0 |
| 249 | 1 1 1 1 1 0 0 1 | 1 0 0 0 0 0 0 0 0 1 0 0 1 0 |
| 250 | 1 1 1 1 1 0 1 0 | 1 0 0 1 0 0 0 0 0 1 0 0 1 0 |
| 251 | 1 1 1 1 1 0 1 1 | 1 0 0 0 1 0 0 0 0 1 0 0 1 0 |
| 252 | 1 1 1 1 1 1 0 0 | 0 1 0 0 0 0 0 0 1 0 0 0 1 0 |
| 253 | 1 1 1 1 1 1 0 1 | 0 0 0 0 1 0 0 0 1 0 0 0 1 0 |
| 254 | 1 1 1 1 1 1 1 0 | 0 0 0 1 0 0 0 0 0 1 0 0 1 0 |
| 255 | 1 1 1 1 1 1 1 1 | 0 0 1 0 0 0 0 0 0 1 0 0 1 0 |

DIGITAL MODULATING METHOD

BACKGROUND OF THE INVENTION

1. Field of the Invention

This invention relates to a digital modulating method used for recording a PCM audio signal, digital data used in a computer, etc. on an optical disc or other recording medium.

2. Description of the Prior Art

In recording digital data on a magnetic tape, optical disc or other recording medium, the digital data to be recorded is modulated. This modulation is called digital modulation or channel coding. There have been proposed various methods of digital modulation. Parameters for evaluation of digital modulating methods include window margin Tw, minimum length between transition Tmin, maximum length between transition Tmax, recording density DR (density ratio), and so on. Digital modulating methods that have been proposed heretofore are directed to removal of a DC component in a frequency spectrum of a modulated signal (so-called DC free) and an increase of the minimum length between transition Tmin or an increase of the window margin Tw.

For example, EFM (eight to fourteen modulation) employed in a CD (compact disc) converts 8 data bits into 14 channel bits, as described in Japanese Patent Laid Open Publication No. Sho 57-48848. Selected are bit patterns of 14 bits which include two or more "0"s (logic 0) sandwiched between "1" (logic 1) and "1". Bit patterns which satisfy this condition comprise 277 patterns from among ($2^{14}$=16,384 patterns, and these 277 patterns include 267 patterns whose Tmax's do not exceed a predetermined value. 256 patterns from among these 267 patterns are associated with 256 patterns of 8-bit data bits by one to one.

When indicating the data bit interval by Tb, the above-mentioned EFM has the parameters indicated below:

Tw=(8/17)Tb
Tmin=3Tw=(24/17)Tb
Tmax=11Tw=(88/17)Tb
DR=(24/17)

Respective symbols of 14 bits satisfy the condition that two or more "0"s are placed between "1" and "1". In order to satisfy this condition also between symbols, 3-bit coupling words are used. Four such coupling words are (000), (100), (010) and (001). One of four coupling words is determined so as to satisfy the parameters Tmin, Tmax, etc. and to minimize DSV (digital sum value; where the summation is done regarding high levels as +1 and low levels as −1) of data after modulation. By deciding the coupling word according to this rule, low frequency components of the modulated data can be reduced. Therefore, data bits in the form of 8 bit words are finally converted into channel bits in the form of 17 bit words.

The EFM, for example, which is one of the conventional digital modulating methods, provides easy extraction of clocks from modulated data and, for reducing low frequency components of demodulated data, the EFM minimizes the maximum length between transition Tmax. However, in case of recording and reproduction not requiring removal of DC components or in case of no need for clock extraction from modulated data, restriction on Tmax may be alleviated. Examples of such cases having no, or reduced, need for removal of DC components are a case not passing through a transformer or other element incapable of DC transmission, and a case using an NRZI or other recording and reproducing method in which edges invertible from "0" to "1" or vice versa have information.

On the other hand, there is proposed a method for forming clock pits and tracking servo pits in preformat areas provided for respective segments in one track of a rewritable optical disc such as magnetooptical disc. Since this method supplies a reproduced output of a clock pit to a PLL and extracts a bit clock, the clock extraction is not affected even if the Tmax of data to be recorded in the data area is long. Further, a tracking servo is done stably even in the case having DC components because there are servo pits for tracking.

Additionally, the EFM, which converts 8 bits into 17 bits, involves a problem that the generation of modulation clocks is diffucult. More specifically, a frequency of a clock regarding data bits and a frequency of a clock regarding channel bits are not held in an integer ratio relationship: therefore, the scale of hardware for producing both clocks is large.

OBJECTS AND SUMMARY OF THE INVENTION

It is, therefore, an object of the invention to provide a digital modulating method capable of alleviating restriction on maximum length between transition Tmax and improving other parameters.

A further object of the invention is to provide a digital modulating method facilitating generation of a clock for data bits and a clock for channel bits.

A still further object of the invention is to provide an information recording medium such as an optical disc on which digital data modulated by the invention process is recorded.

According to an aspect of the invention, there is provided a digital modulating method for coding M data bits into N channel bits (M<N), being configured to maximize the minimum value of the number of successive "0"s sandwiched between "1" and "1" in a row of coded bits.

According to another aspect of the invention, there is provided a digital modulating method for coding M data bits into N channel bits (M<N), being configured to satisfy the relationship (N=aM) (where a is a positive integer equal to or larger than 2).

According to still another aspect of the invention, there is provided an information recording medium such as an optical disc on which a digital signal having been modulated and recorded by the above digital modulating methods.

Therefore, since the inventive method is configured to maximize the number of successive "0"s sandwiched between "1" and "1", Tmin can be elongated. Further, removal of restriction on the maximum length between transition Tmax can decrease N as compared to other modulating methods in which the number of successive "0"s is identical.

The above, and other, objects, features and advantages of the present invention will become readily apparent from the following detailed description thereof which is to be read in connection with the accompanying drawings.

BRIEF DESCRIPTION OF THE DRAWINGS

FIGS. 2A to 2H are schematic views showing conversion tables for a code converter;

FIGS. 4A to 4H are schematic views showing conversion tables for a code converter;

DETAILED DESCRIPTION OF PREFERRED EMBODIMENT

Figure 1:
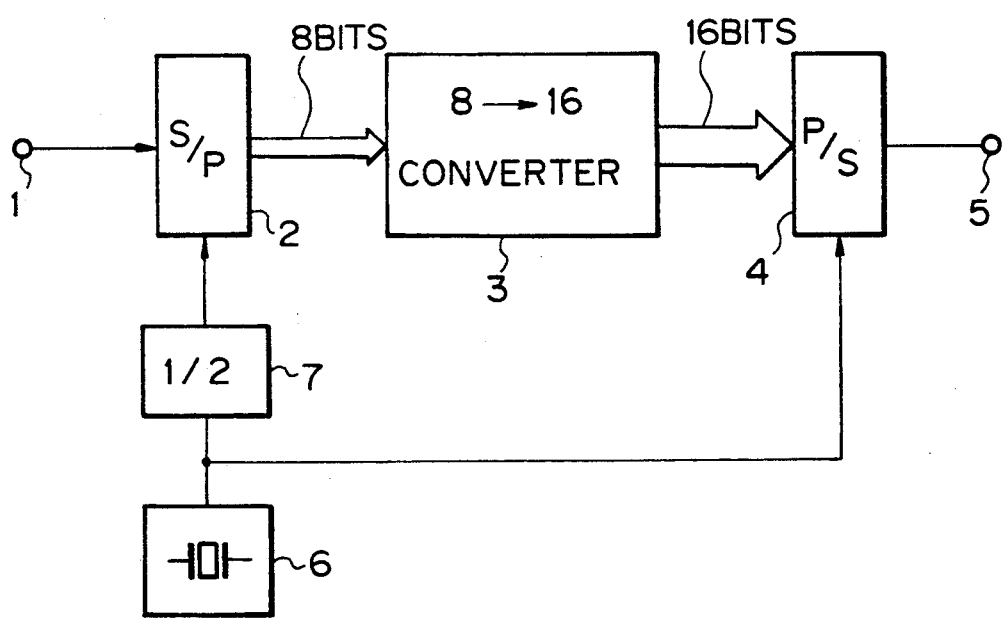
FIG. 1 is a block diagram of an embodiment of the invention.

An embodiment of the invention is described below referring to the drawings.

In FIG. 1, reference numeral 1 denotes an input terminal which is supplied with digital data to be recorded on a recording medium such as magnetooptical disc, numeral 2 refers to a serial-parallel converter for converting input data into data of 8 parallel bits, and numeral 3 denotes a data converter.

The data converter 3, which is made of ROM, PLA and so on, is fed with data bits $d_1, d_2, \ldots, d_8$ in the form of 8 bits and outputs channel bits $c_1, c_2, \ldots, c_{16}$ in the form of 16 bits. Tables for converting 8 bits into 16 bits are, for example, as shown in FIGS. 2A to 2H. The data Of 16 parallel bits $c_1, c_2, \ldots, c_{16}$ from the data converter 3 is applied to a parallel-serial converter 4, and recording data of serial bits is obtained at an output terminal 5. The recording data is fed to an optical pickup not shown and recorded on a magneto-optical disc.

The magneto-optical disc is provided with concentrical or vortex tracks. Each track is divided into a predetermined number of sectors and each sector is subdivided into segments. Servo areas are prerecorded on respective segments in an embossing process. Formed in the servo area are an access code coinciding with a lower significant bit of a track address, a clock pit for clock extraction and a wobbling pit for detection of a tracking error. The recording data is recorded in a data area subsequent to the servo area. The access code is used in seeking operation for seeking a target track. When the data is reproduced from the disc, a playback clock synchronizing with a reproduced output of the clock pit in the servo area is formed by the PLL, and the tracking servo is activated by the reproduced output of the wobbling pit.

In order to generate a clock for modulation, a clock generator shown at 6 is provided, and an output signal of the clock generator 6 is supplied to the parallel-serial converter 4. The output signal of the clock generator 6 is fed to a ½ frequency divider 7, and a clock whose frequency is divided into ½ by the ½ frequency divider 7 is fed to the serial-parallel converter 2. This embodiment is a digital modulation for converting M data bits into N channel bits, where M=8 and N=16. Therefore, frequencies of clocks required for data bit processings and channel bit processings are held in an integer ratio relationship, and a simple circuit arrangement using the ½ frequency divider 7 can generate required clocks.

The code conversion tables shown in FIGS. 2A to 2H comply with the rule that the data ($c_1$ to $c_{16}$) obtained by such modulatior never fails to place 2 or more "0"s between "1" and "1", and the rule is complied with also when symbols of 16 bits are coupled. In order to satisfy the foregoing rule by converting data of 8 bits, at least 14 bits are necessary as they are in case of EFM. More specifically, excluding the pattern whose 16 bits are all "0", there are 276 patterns which satisfy the foregoing rule, and ($2^8$=256) pattern of data are associated by one to one with 256 pattern among the 276 patterns. FIGS. 2A to 2H show that last 2 bits $c_{15}$ and $c_{16}$ of the channel bits are both "0", and they never fail to comply with the rule that two or more "0"s are present between "1" and "1" even when symbols of 16 bits are coupled.

Parameters of the digital modulation according to this embodiment are shown below. Tb indicates intervals of data bits.

Tw=(½)Tb
Tmin=3Tw=(3/2)Tb
Tmax=19Tw=(19/2)Tb
DR=3/2

In the code conversion tables shown in FIGS. 2A to 2H "0"s are added to the EFM conversion tables as two channel bits $c_{15}$ and $c_{16}$. In this case, 2-bit "0"s may be added to the head of 14 bits obtained by the EFM conversion tables or, 1-bit "0" may be added to the head and tail, respectively. It will be understood that code conversion tables different from the EFM conversion tables can be used.

Any other integer ratio in lieu of 2 as the relationship between M and N is also acceptable to facilitate clock generation.

As mentioned above, this invention does not necessarily require removal of DC components, and can remove restriction on the maximum length between transition Tmax in a recording/reproducing mode which can form clocks synchronizing with reproduced data, by other means of recorded data. Therefore, the minimum length between transition Tmin and the recording density DR which are parameters other than the maximum length between transition Tmax can be improved.

On the other hand, required degrees of reducing low frequency components or Tmax usually vary depending on characteristics of transmission paths, contents of transmitted data, and so on. A transmission path may have a very bad transmission characteristic as for low frequency components and may require more suppression of low frequency components than that of the EFM. Another transmission path may not necessarily require removal of low frequency components or extraction of clocks from modulated data.

Preparation of a (different digital modulator, considering such variant characteristics of transmission paths and contents of transmitted data, needs development and design of conversion rules, modulator, demodulator and so on, separately. On the other hand, this invention can provide a digital modulator and an associated demodulator circuit having a simple circuit arrangement and being readily adaptive to variant characteristics of transmission paths.

Another embodiment of the invention will now be described referring to the drawings.

Figure 3:
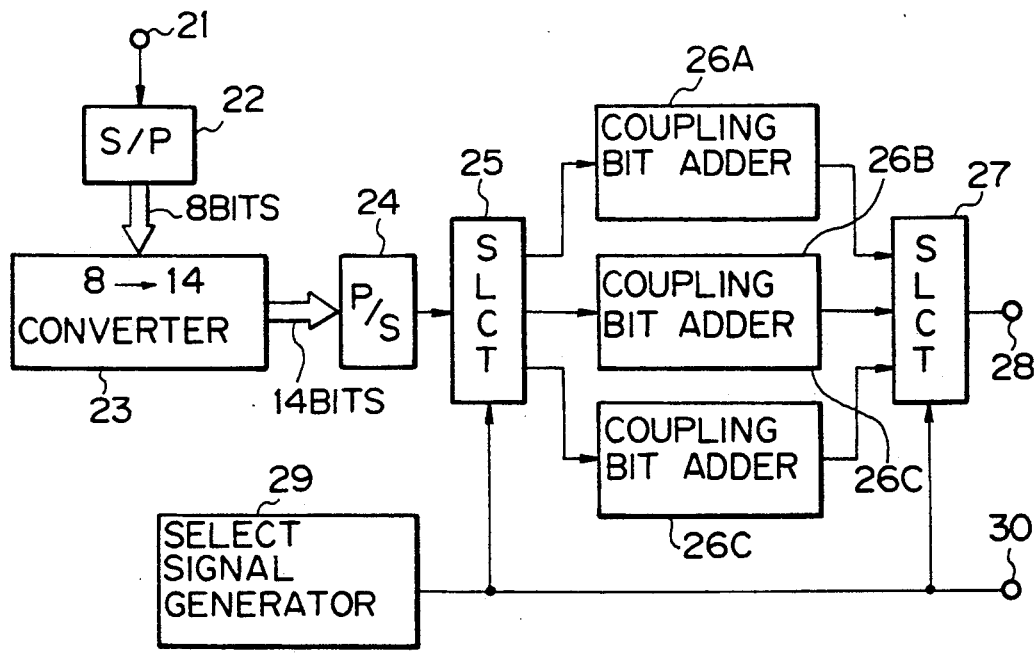
FIG. 3 is a block diagram of a modulator in another embodiment of the invention.

In FIG. 3, reference numeral 21 refers to an input terminal supplied with digital data to be recorded on a recording medium such as magneto-optical magnetic disc, numeral 22 refers to a serial-parallel converter for converting input data into data of 8 parallel bits, and numeral 23 denotes a data converter.

The data converter 23, which consists of ROM, PLA and others, is supplied with data bits d1, d2, . . . and d8 in the form of 8 bits, and supplies channel bits c1, c2, . . . and c14 in the form of 14 bits. Tables for converting 8 bits into 14 bits are, for example, as shown in FIGS. 4A to 4H which are the same conversion tables as the formerly proposed EFM modulations. More specifically, the code conversion tables shown in FIGS. 4A to 4H comply with the rule that two or more "0"s are inserted between "1" and "1", and limit such "0"s between "1" and "1" within 10 pieces in order to shorten Tmax. In order to convert data of 8 bits and satisfy the foregoing rule, at least 14 bits are required. That is, there are 267 patterns in which 14 bits satisfy the above rule, and ($2^8=256$) patterns of data are associated by one to one with 256 pattern from among 267 patterns.

The data of 14 parallel bits c1, c2, . . . and c14 from the data converter 23 are fed to the parallel-serial converter 24, from which is obtained a first code signal in the form of serial bits.

The first code signal is fed to the selector 25. The selector 25 has three output terminals which are connected to coupling bit adders 26A, 26B and 26C.

Figure 5:
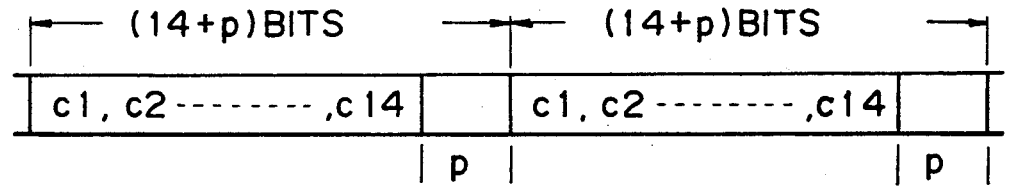
FIG. 5 is a schematic view for use in explanation of modulated data.

As shown in FIG. 5, the coupling bit adders 26A, 26B and 26C are circuits which add coupling bits of p bits as a second code signal to each junction between a 14-bit code signal c1 to c14 and an adjacent such signal formed by the data converter 23.

The coupling bit adder 26A adds coupling bits of (p=2) bits, the coupling bit adder 26B adds coupling bits of (p=3) bits, and the coupling bit adder 26C adds coupling bits of (p=4) bits. These coupling bit adders 26A, 26B and 26C each add coupling bits so as to satisfy the requirement regarding the Tmin in the data converter 23, i.e., the condition that two or more successive "0"s are present between "1" and "1".

The same type of coupling bit adder as used in conventional EFM modulation is employed as the coupling bit adder 26B of (p=3). More specifically, prepared are 3-bit patterns (000), (100), (010) and (001) having two or more successive "0"s between "1" and "1". A 3-bit pattern is determined by satisfying the condition of Tmax (ten or less "0"s between "1" and "1") and by considering which coupling bits should be inserted into two successive 14-bit patterns to minimize DSV. Therefore, an output signal of the coupling bit adder 26B is made of a symbol of 17 bits corresponding to 8-bit data. The output signal of the coupling bit adder 26B is fed to a selector 27.

Parameters of modulated data obtained from the coupling bit adder 26B are shown below, where Tb indicates data bit intervals.

Tw=(8/17)Tb
Tmin=3Tw=(24/17)Tb
Tmax=11Tw=(88/17)Tb
DR=(24/17)

The coupling bit adder 26A adds 2-bit coupling bits at 14 bit intervals. Therefore, an output signal of the coupling bit adder 26A is made of a 16-bit symbol corresponding to 8-bit data. The output signal of the coupling bit adder 26A is fed to the selector 27. The coupling bit adder 26A adds coupling bits (00) to the end of each 14-bit symbol of the EFM conversion tables shown in FIGS. 4A to 4H. In this case, 2-bit "0"s may be added to the head of each set of 14 bits obtained from the EFM conversion tables, or 1-bit, "0" may be added to the head and tail, respectively. Further, 2-bit patterns of (10) and (01) may be prepared in addition to (00) to determine coupling bits so as to minimize DSV in the same manner as the coupling bit adder 26B.

Parameters of modulated data obtained from the coupling bit adder 26A are shown below.

Tw=(8/16)Tb=($\frac{1}{2}$)Tb
Tmin=3Tw=(3/2) Tb
Tmax=19Tw=(19/2) Tb . . . coupling bit (0, 0) only
Tmax=11Tw=(11/2) Tb . . . coupling bits (0, 0), (1, 0), (0, 1)
DR=3/2

The coupling bit adder 26C is used in case of (p=4). In the same manner as the coupling bit adder 26B, bit patterns (0000), (0001), (0010), (0100), (1000) and (1001) are prepared in the coupling bit adder 26C, and one of the coupling bits is determined, considering which one of the coupling bits should be inserted between successive two 14-bit patterns to minimize DSV. Since more patterns of coupling bits are prepared than those prepared in the coupling bit adder 26B; better suppression of low frequency components can be provided. Parameters of modulated data obtained from the coupling bit adder 26C are shown below.

Tw=(8/18) Tb=(4/9)Tb
Tmin=3Tw=(4/3) Tb
Tmax=11Tw=(44/9)Tb
DR=4/3

An output signal of the coupling bit adder 26C is fed to the selector 27.

It is evident by comparison among the foregoing parameters that the output signal of the coupling bit adder 26B or 26C is suitable for a system to extract clocks from modulated data itself. In contrast, the output signal of the coupling bit adder 26A in the case where a fixed data (00) is suitable for a system having other clock extracting means such as clock bits of a magneto-optical disc. Recording density can be maximized by a system using the coupling bit adder 26A, and it is minimized by a system using the coupling bit adder 26C. Low frequency components, however, can be reduced most by the system using the coupling bit adder 26C.

Any one output signal of the coupling bit adders 26A, 26B and 26C selected by the selector 27 is extracted at an output terminal 28. A select signal from a select signal generator 29 is supplied to the selectors 25 and 27, and one output from the coupling bit adders 26A, 26B and 26C is selected in response to the select signal. The select signal generator 29 generates the select signal in response to a key signal, instructions from a control circuit and so on. The modulated data and the select signal taken out at the output terminals 28 and 30, respectively, are converted into recording data by a formating circuit not shown. The recording data is fed to an optical pickup or other recording means via a recording amplifier and recorded on a magneto-optical disc or other recording medium.

Figure 6:
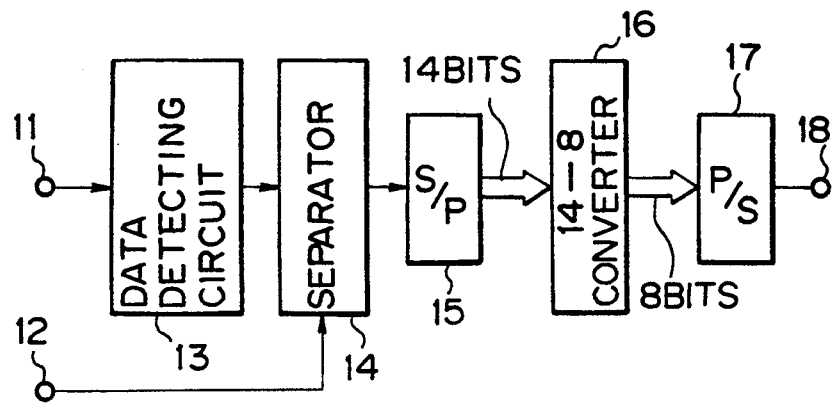
FIG. 6 is a block diagram of a demodulator.

FIG. 6 shows an arrangement of a digital demodulator associated with the foregoing digital modulator. In FIG. 6, an input terminal shown at 11 is supplied with reproduced data, and an input terminal shown at 12 is supplied with a select signal which is reproduced together with reproduced data. The reproduced data is fed to a data detector 13 wherein waveform shaping is done. An output signal of the data detector 13 is supplied to a separator 14.

The separator 14 excludes the coupling bits and extracts the first code signal alone. The bit number p of the coupling bits is 2 bits, 3 bits or 4 bits as indicated above. The select signal indicates the bit number of the coupling bits. Therefore, it is fed to the separator 14. The separator 14 separates the first code signal alone in which 14 bits form a symbol.

An output signal of the separator 14 is supplied to a serial-parallel converter 15 and converted into parallel data of 14 bits. The 14-bit data is fed to a data converter 16, which converts the 14-bit data into 8-bit data, in contrast to the modulation process, according to the conversion tables shown in FIGS. 4A to 4H. The data converter 16 is made of ROM, PLA and so on. The 8-bit parallel data from the data converter 16 is fed to a parallel-serial converter 17, and serial output data is obtained at an output terminal 18.

The data conversion tables are completely identical in three different modulating methods in the foregoing embodiment. However, the invention can be also applied to the case where the conversion rule is identical in most part and different in minor part. The modulating methods are not limited to three different kinds.

As mentioned above, this invention uses a common circuit for converting data excluding coupling bits for different modulating methods. Therefore, the circuit having a simple construction, is adaptive to any characteristics of transmission paths, contents of data to be transmitted, and so on.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

What is claimed is:

1. A digital modulating method for coding M data bits in to N channel bits (M<N) comprising the steps of: forming said N channel bits of a number of bits that satisfies N=αM, where α is 2; arranging a number of successive "0"s between "1" and "1" in a row of coded bits; and wherein said coding of M data bits comprises eight to fourteen modulation and further comprising the steps of selecting a pattern of successive fourteen channel bits in said N channel bits and a pattern of the eight to fourteen modulation to be identical.

2. A digital modulating method according to claim 1, wherein the step of arranging a number of successive "0"s between "1" and "1" in a row of coded data bits comprises arranging two successive "0"s.

3. A digital modulating method according to claim 1, further comprising the step of selecting two channel bits exclusive of said fourteen channel bits to be "0".

4. A digital modulating method for coding M data bits into N channel bits (M<N) comprising the steps of selecting M and N to satisfy the relationship N=αM, and selecting α to be an integer equal to 2, and wherein said coding of said M data bits comprises eight to fourteen modulation and further comprising the step of selecting a pattern of successive fourteen channel bits in said N-channel bits and a pattern of the eight to fourteen modulation to be identical.

5. A digital modulating method according to claim 4, further comprising the step of selecting two channel bits exclusive of said fourteen channel bits to be "0".

6. An information recording medium having recorded thereon digital signals modulated so that a minimum value of a number of successive "0"s sandwiched between "1" and "1" in a row of coded bits from M data bits into N channel bits (M<N) is a maximum, wherein the coded bits from M data bits are modulated according to eight to fourteen modulation and a pattern of fourteen channel bits in the N channel bits is identical to a pattern of the eight to fourteen modulation.

7. An information recording medium according to claim 6, wherein said N channel bits satisfy N=αM, where α is an integer equal to or larger than 2.

8. An information recording medium according to claim 6, wherein recording tracks of said information recording medium comprise a servo area on which pits for servo control are pre-recorded and a data area on which data is recorded.

9. An information recording medium according to claim 6, wherein said information recording medium comprises a magneto-optical disc.

10. A digital modulating circuit comprising:
converting means for converting a predetermined unit of input data into a first code signal of successive words according to a predetermined conversion rule;
a plurality of coupling bits adding means each receiving said first code signal, each for generating a respective second code signal of successive words having a different number of bits to be added to a junction adjacent to successive words of said first code signal, and each for selectively inserting successive words of said second code signal having a different number of bits at each said junctions; and
means for selecting one of said plurality of coupling bit adding means based on a predetermined minimum length between transitions in said converting means when converting said input data into said first code signal.

11. A digital modulating circuit according to claim 10, wherein said first code signal is generated by said converting means in accordance with the conversion rule of eight to fourteen modulation that comprises said predetermined conversion rule.

12. A digital demodulating circuit supplied with modulated data in which a word of a selected one of a plurality of second code signals of different relative bit numbers than said modulated data was installed at a junction adjacent successive words of a first code signal converted according to a predetermined conversion rule, comprising:
separator means responsive to a signal identifying which one of the plurality of second code signals was inserted and for excluding said second code signal from said modulated data and extracting said first code signal; and
converting means for converting said first code signal into original data according to said predetermined conversion rule.

* * * * *